United States Patent [19]

Fikart et al.

[11] Patent Number: 5,434,522
[45] Date of Patent: Jul. 18, 1995

[54] FREQUENCY DOUBLER CIRCUIT HAVING A DIODE QUAD WITH A GROUNDED PORT

[75] Inventors: Josef L. Fikart, Port Moody; Yongnan Xuan, Burnaby, both of Canada

[73] Assignee: MPR Teltech Ltd., British Columbia, Canada

[21] Appl. No.: 117,941

[22] Filed: Sep. 8, 1993

[51] Int. Cl.⁶ .............................................. H03B 19/00
[52] U.S. Cl. ................................... 327/122; 327/448; 327/494; 327/588
[58] Field of Search ..................... 307/219.1, 271, 321, 307/494, 644; 328/15, 25, 140; 327/113, 122, 118, 494, 504, 448, 563, 65, 588

[56] References Cited

U.S. PATENT DOCUMENTS 4,639,679  1/1987  Kasperkovitz et al. ............. 328/15

FOREIGN PATENT DOCUMENTS 1075366  2/1984  U.S.S.R. ................... 328/15

Primary Examiner—William L. Sikes
Assistant Examiner—James A. Dudek
Attorney, Agent, or Firm—Myers, Liniak & Berenato

[57] ABSTRACT

A microwave frequency doubler circuit, which includes a full wave rectifier for rectifying an input signal and to provide two outputs, and a differential amplifier having inputs connected to the two outputs.

5 Claims, 1 Drawing Sheet

FREQUENCY DOUBLER CIRCUIT HAVING A DIODE QUAD WITH A GROUNDED PORT

FIELD

The present invention relates to a broad band frequency doubling of microwave signals with high conversion efficiency, and particularly to such an arrangement for effectively suppressing fundamental and unwanted odd harmonics at the output in both unbalanced and balanced applications without using baluns or transformers.

BACKGROUND

Frequency doublers are widely used to extend the upper frequency of fixed or variable oscillators. Typically, frequency doubling is realized by feeding the signal through nonlinear devices, such as diodes or transistors, and then extracting the second harmonic and rejecting other frequency components.

The basic problem in designing a doubler is that the fundamental frequency energy appears at the output port. This is especially a problem when the bandwidth approaches an octave so that the highest frequency at the input band overlaps that of the lower band of the output. Typical of previous solutions employed are those disclosed in papers by C Rauscher entitled "High Frequency Doubler Operation of GaAs Field-Effect Transistors", IEEE Trans. Microwave Technology and Techniques, volume 31, No. 6, June 1983, pp. 462–473 and another by P. D. Chow, et al., "A 44 GHz HEMT Doubler/Amplifier Chain" IEEE Int. Symp on Microwave Technology and Techniques, 1990, pp 603–606.

In such previous designs, circuit components such as micro strip quarter-wave length or radial open stubs are used in the output port of the doublers, which shunt the fundamental frequency component to ground to prevent it from appearing at the output. Similar techniques may also be used at the input port to short-circuit the second harmonic to ground to achieve good input-output port isolation.

However, these techniques are limited to narrow band applications, because micro strip quarter-wave length open stubs are difficult to realize over a wide range configuration. The state of the art of such circuits are described in a publication by R. Gilmore, entitled, "Concepts in the Design of Frequency Multipliers", in the Microwave Journal, March 1987, pp 129–139.

In these circuits, baluns (or transformers) are employed to couple input signals to the non-linear devices, and to couple the energy at the wanted second harmonic frequency to the output ports. Since the configuration inherently suppresses the fundamental and odd harmonics, wider bandwidth can be achieved. Unfortunately, there are some drawbacks associated with these circuits. Firstly, the loss of the baluns used at the input and/or output ports inevitably degrades the conversion efficiency of the doubler. Secondly, the use of the baluns increases considerably the complexity and physical dimensions of the doubler circuit.

It is an object of the present invention to provide an improved microwave frequency doubler circuit.

SUMMARY OF THE INVENTION

According to the invention there is provided a microwave frequency doubler circuit which has a full wave rectifier having an input port, two output ports coupled to said input port by diodes and a fourth port which is grounded through a capacitor 13 and coupled by diodes to each of said two output ports so as to make the two output ports at the same potential with respect to ground at the fundamental frequency and balanced with respect to ground at the second harmonic. A differential amplifier has inputs connected to the two output ports.

Advantageously, the inductor is formed as a conductor on a microwave circuit.

Each of the bridge outputs is coupled to a corresponding input of the differential amplifier by a DC decoupling capacitor.

The present invention solves the various problems associated with the above-mentioned available techniques. The second harmonic is generated effectively by full-wave rectifying the input signal using a quad diode bridge, and then is amplified by a differential amplifier. Fundamental and unwanted odd harmonics are effectively suppressed by not only the balanced configuration, but also by the common mode rejection properties of a differential amplifier. While a circuit structure requiring no baluns is simple, broad band operation can be implemented for both unbalanced and balanced applications.

BRIEF DESCRIPTION OF THE DRAWING

The novel features believed characteristic of the invention are set forth in the appended claims. The invention itself, however, as well as other features and advantages thereof, will be best understood by reference to the detailed description which follows, read in conjunction with the accompanying drawing, wherein:

DETAILED DESCRIPTION WITH REFERENCE TO THE DRAWINGS

Figure 1:
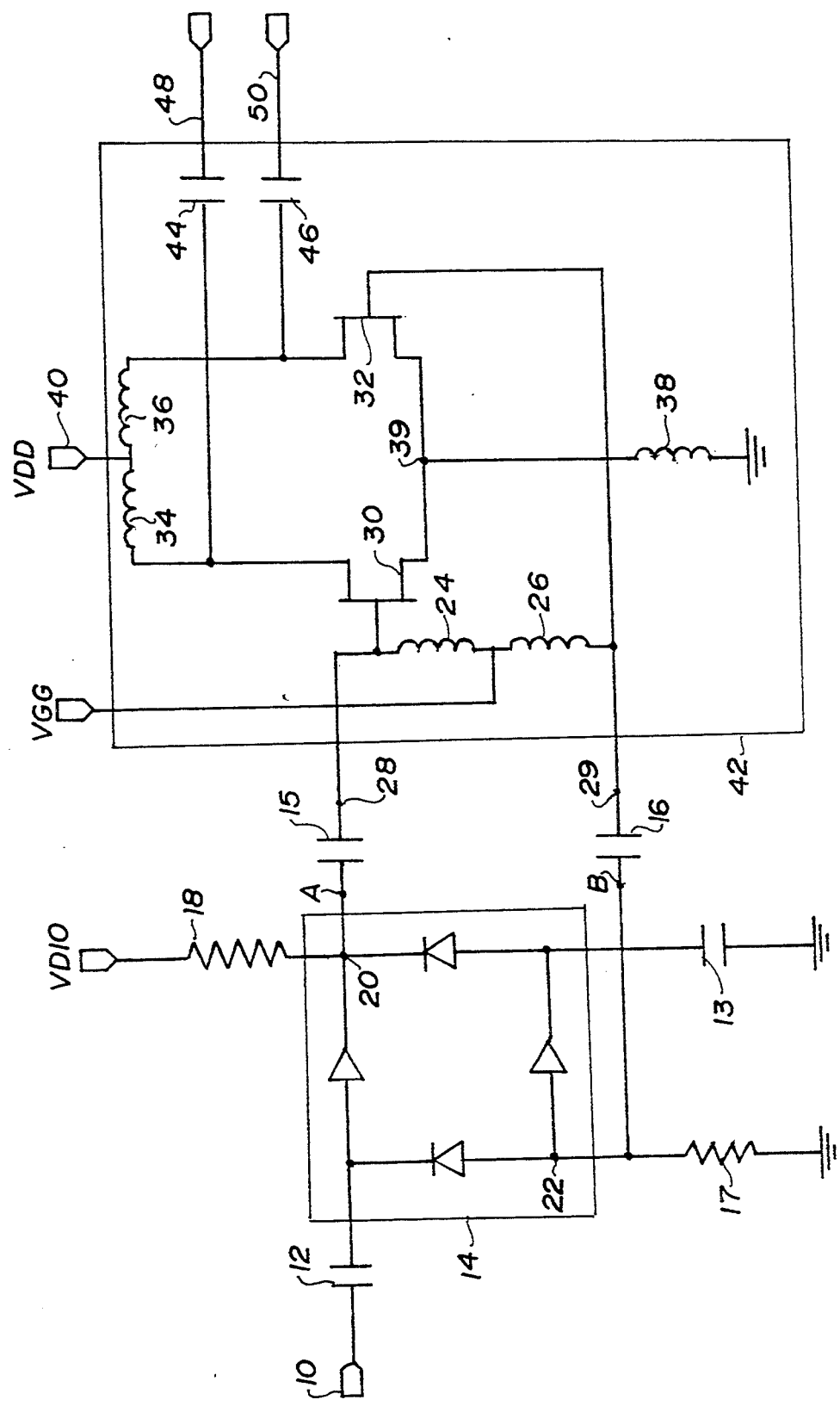
FIG. 1 is a circuit diagram of the frequency doubler employing a quad bridge followed by a differential amplifier.

Referring to FIG. 1 a signal input terminal 10 to which there is directed an input signal source (not shown) is coupled via DC decoupling capacitor 12 to an input of a quad diode bridge 14. One terminal 20 from the bridge 14 is coupled to DC decoupling capacitor 15 while another 22 is coupled to a DC decoupling capacitor 16. Resistor 17 connects between terminal 22 and ground while resistor 18 connects between terminal 20 and a source of DC bias potential VDIO. The other end of capacitors 15 and 16 connect to respective ends of a pair of series-connected inductors 24 and 26 of equal inductance. The junction of the inductors 24 and 26 is connected to a bias source $V_{GG}$. Terminal 28 from the capacitor 15 is connected to the gate of field effect transistor 30 while terminal 29 from capacitor 16 is connected to the gate of a second field effect transistor 32. The sources of the transistors 30 and 32 are connected to one end of an inductor 38 which is sufficiently large such that it acts as a simple active current source and keeps the total current of the two transistors 30 and 32 constant.

The drains of transistors 30 and 32 are connected to inductors 34 and 36, respectively. The junctions of the inductors 34 and 36 are joined and connect to a source of DC voltage $V_{DD}$. The drains of transistors 30 and 32 also connect through DC decoupling capacitors 44 and 46 to output terminals 48 and 50, respectively.

In operation a signal source of frequency f is applied to input terminal 10 and is full-wave rectified by the quad diode bridge 14. The output from the bridge at terminals 20 and 22 consists of odd and even harmonics. The odd ones, including the fundamental component, are in common mode. In balanced applications, they cancel each other and are further rejected by the differential amplifier 42. Ideally, with a perfectly symmetric circuit, none of the odd harmonics will appear at the output terminals 48 and 50. In practice circuit symmetry can be achieved using available technology.

In unbalanced applications, the odd harmonics are suppressed by the differential amplifier 42 because of the well-known common mode rejection characteristics of differential amplifiers. As a result, in both balanced and unbalanced applications, odd order frequency components are rejected.

In contrast to the odd harmonics, the even ones at terminals 20 and 22 are in differential mode. The desired second harmonic is amplified by the differential amplifier 42. The unbalanced outputs can be obtained at either of the terminals 48 and 50, while balanced outputs can be obtained between the two terminals 48 and 50. Since the frequencies of all other even harmonics (4th, 6th, ...) are higher than the second harmonic by at least two times the fundamental frequency, they can readily be removed.

The desired second harmonic is effectively generated by full-wave rectification of the input signal and further amplified by the differential amplifier working in a linear region. As a result conversion efficiency of the doubler is greatly enhanced. Use of the inductor 38 makes the doubler simpler and more attractive.

Accordingly, while this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modification or embodiments as fall within the true scope of the invention.

We claim:

1. A microwave frequency doubler circuit, comprising:
   (a) a full wave rectifier having an input port, two output ports coupled to said input port by diodes and a fourth port which is grounded through a capacitor and coupled by diodes to each of said two output ports so as to make the two output ports at equipotential with respect to ground at the fundamental frequency and balanced with respect to ground at the second harmonic; and
   (b) a differential amplifier having inputs connected to said two output ports.

2. A circuit according to claim 1, wherein said differential amplifier has two field effect transistors having their sources connected together and including an inductor connected from said sources to ground sufficiently large so that RF current flowing therethrough is negligible at the frequencies of operation.

3. A circuit according to claim 1, wherein a cathode of a first diode is coupled to one of said output ports, an anode of the first diode is coupled to the input port, an anode of a second diode is coupled to the other output port, a cathode of the second diode is coupled to the input port, an anode of a third diode is coupled to a port grounded through a capacitor, a cathode of the third diode is coupled to the first output port, a cathode of a fourth diode is coupled to the grounded port, and an anode of the fourth diode is coupled to the second output port, wherein the grounded port is connected to ground through a capacitor.

4. A circuit according to claim 2, wherein the inductor is formed as a conductor on a microwave circuit.

5. A circuit according to claim 1, wherein said differential amplifier and inductor are formed on a microwave circuit.

* * * * *